(12) United States Patent
Lu et al.

(10) Patent No.: US 9,395,072 B2
(45) Date of Patent: Jul. 19, 2016

(54) ILLUMINATION DEVICE

(71) Applicant: INDUSTRIAL TECHNOLOGY RESEARCH INSTITUTE

(72) Inventors: Su-Tsai Lu, Hsinchu (TW); Wen-Yung Yeh, Hsinchu (TW); Sheng-Feng Chung, Hsinchu (TW); Bao-Shun Yau, Kaohsiung (TW); Chen-Kun Chen, Zhubei (TW); Yi-Ming Chang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/819,035

(22) Filed: Aug. 5, 2015

(65) Prior Publication Data
US 2015/0338078 A1    Nov. 26, 2015

Related U.S. Application Data

(63) Continuation-in-part of application No. 14/447,152, filed on Jul. 30, 2014, now Pat. No. 9,224,790.

(60) Provisional application No. 61/903,801, filed on Nov. 13, 2013, provisional application No. 62/034,130, filed on Aug. 6, 2014.

(51) Int. Cl.
*H01L 27/32*     (2006.01)
*F21V 23/04*    (2006.01)
(Continued)

(52) U.S. Cl.
CPC ........... *F21V 23/0485* (2013.01); *F21V 23/003* (2013.01); *G06F 3/0412* (2013.01);
(Continued)

(58) Field of Classification Search
CPC .......................... H01L 27/323; H01L 27/3297
See application file for complete search history.

(56) References Cited

U.S. PATENT DOCUMENTS

| 5,707,745 A | 1/1998 | Forrest et al. |
| 5,721,160 A | 2/1998 | Forrest et al. |

(Continued)

FOREIGN PATENT DOCUMENTS

| TW | 201117451 A | 5/2011 |
| TW | I383528 B | 1/2013 |

(Continued)

OTHER PUBLICATIONS

Hisahiro Sasabe et al., "Ultra high-efficiency multi-photon emission blue phosphorescent OLEDs with external quantum efficiency exceeding 40%", Organic Electronics, 2012, pp. 2615-2619, vol. 13.
(Continued)

*Primary Examiner* — Ida M Soward
(74) *Attorney, Agent, or Firm* — Birch, Stewart, Kolasch & Birch, LLP

(57) ABSTRACT

An illumination device includes an OLED panel, an electrode structure, and a control module. The OLED panel includes a light-emitting layer configured to emit a light beam. The electrode structure is overlaid on the OLED panel. The electrode structure includes a first touch electrode including at least two conductive portions, and the conductive portions of the first touch electrode are electrically connected to the other conductive portions. The control module is electrically connected to the OLED panel and the first touch electrode. The light-emitting layer further includes a light-emitting material, and a width of the light-emitting material is greater than half of a width of the first touch electrode.

20 Claims, 18 Drawing Sheets

(51) Int. Cl.
*F21V 23/00* (2015.01)
*G06F 3/041* (2006.01)
*F21S 6/00* (2006.01)
*F21Y 105/00* (2016.01)

(52) U.S. Cl.
CPC .......... *H01L27/323* (2013.01); *H01L 27/3297* (2013.01); *F21S 6/00* (2013.01); *F21Y 2105/008* (2013.01); *H01L 2251/5361* (2013.01)

(56) References Cited

U.S. PATENT DOCUMENTS

| | | | |
|---|---|---|---|
| 5,757,026 A | 5/1998 | Forrest et al. | |
| 8,017,254 B2 | 9/2011 | Itai | |
| 8,552,936 B2* | 10/2013 | Hente | H03K 17/962 345/174 |
| 8,860,685 B2* | 10/2014 | Takeuchi | G06F 3/0418 178/18.06 |
| 8,922,522 B2* | 12/2014 | Atsuta | G06F 3/044 345/173 |
| 9,086,753 B2* | 7/2015 | Hente | G06F 3/0412 |
| 2006/0188745 A1 | 8/2006 | Liao et al. | |
| 2007/0018969 A1 | 1/2007 | Chen et al. | |
| 2009/0027371 A1 | 1/2009 | Lin et al. | |
| 2010/0045632 A1* | 2/2010 | Yilmaz | G01D 5/2405 345/174 |
| 2010/0182282 A1 | 7/2010 | Kurokawa et al. | |
| 2010/0225615 A1 | 9/2010 | Kurokawa | |
| 2010/0295824 A1* | 11/2010 | Noguchi | G02F 1/13338 345/175 |
| 2010/0302192 A1 | 12/2010 | Park et al. | |
| 2010/0328239 A1* | 12/2010 | Harada | G06F 3/0412 345/173 |
| 2011/0101314 A1 | 5/2011 | Kim | |
| 2011/0122098 A1* | 5/2011 | Kurokawa | G06F 3/0412 345/175 |
| 2011/0284899 A1 | 11/2011 | Hack et al. | |
| 2011/0310056 A1 | 12/2011 | Chang | |
| 2012/0056835 A1* | 3/2012 | Choo | G06F 3/0412 345/173 |
| 2012/0229418 A1* | 9/2012 | Schwartz | G06F 3/0418 345/174 |
| 2012/0256963 A1* | 10/2012 | Suzuki | G06F 3/04883 345/661 |
| 2012/0274612 A1* | 11/2012 | Sogabe | H01L 27/124 345/204 |
| 2012/0306928 A1* | 12/2012 | Yoshinaka | G06F 3/04883 345/660 |
| 2013/0127776 A1* | 5/2013 | Guard | G06F 3/0412 345/174 |
| 2013/0147740 A1 | 6/2013 | Wang et al. | |
| 2013/0169591 A1 | 7/2013 | Hung et al. | |
| 2013/0207094 A1 | 8/2013 | Tchakarov | |
| 2013/0222282 A1 | 8/2013 | Huang et al. | |
| 2013/0278540 A1* | 10/2013 | Yilmaz | G06F 3/0416 345/174 |
| 2013/0307810 A1* | 11/2013 | Verweg | G06F 3/044 345/174 |
| 2013/0321316 A1 | 12/2013 | Wu et al. | |
| 2014/0176819 A1* | 6/2014 | Yilmaz | G06F 1/1692 349/12 |
| 2014/0299879 A1 | 10/2014 | Yamazaki | |
| 2014/0375910 A1 | 12/2014 | Tada et al. | |

FOREIGN PATENT DOCUMENTS

| | | |
|---|---|---|
| TW | 201349613 A | 12/2013 |
| TW | M467954 U | 12/2013 |

OTHER PUBLICATIONS

Jongwoon Park et al., "Optical and barrier properties of thin-film encapsulations for transparent OLEDs", Organic Electronics, 2012, pp. 1956-1961, vol. 13.

Jongwoon Park et al., "Optical and thermal properties of large-area OLED lightings with metallic grids", Organic Electronics, 2012, pp. 184-194, vol. 13.

M. Slawinski et al., "Investigation of large-area OLED devices with various grid geometries", Organic Electronics, 2013, pp. 2387-2391, vol. 14.

Takayuki Chiba et al., "Ultra-high efficiency by multiple emission from stacked organic light-emitting devices", Organic Electronics, 2011, pp. 710-715, vol. 12.

* cited by examiner

ILLUMINATION DEVICE

CROSS-REFERENCE TO RELATED APPLICATIONS

The application is a Continuation-In-Part of and claims priority from U.S. patent application Ser. No. 14/447,152, filed Jul. 30, 2014, the content of which is hereby incorporated by reference in its entirety. This application also claims the benefit of U.S. Provisional Application No. 62/034,130, filed on Aug. 6, 2014, the contents of which are incorporated herein for reference.

TECHNICAL FIELD

The disclosure relates to an illumination device, and in particular to an illumination device with touch functionality.

BACKGROUND

The characteristics of OLED (Organic Light-Emitting Diodes) panels, such as emitting a surface light and having a film structure, make OLED panels ideal for application in the illumination field, as has been done recently. Therefore, the appearance and design of light fixtures can be varied due to the integration of OLED panels as a light source.

However, in general, the service life of OLED panels is short, and thus the purchase intention of light fixtures using OLED panels as a light source is caused. Furthermore, although existing light fixtures using OLED panels as a light source have been generally adequate for their intended purposes, they have not been entirely satisfactory in all respects. Consequently, it would be desirable to provide a solution for improving light fixtures.

SUMMARY

The present disclosure provides an illumination device having an OLED panel, which is a surface light source and has a film structure. Furthermore, the illumination device provides touch functionality, and the service life of the OLED panel is increased.

The present disclosure provides an illumination device including an OLED panel, an electrode structure, and a control module. The OLED panel includes a light-emitting layer configured to emit a light beam. The electrode structure is overlaid on the OLED panel. The electrode structure includes a first touch electrode including at least two conductive portions, and the conductive portions of the first touch electrode are electrically connected to the other portions. The control module is electrically connected to the OLED panel and the first touch electrode. The light-emitting layer further includes a light-emitting material, and a width of the light-emitting material is greater than half of a width of the first touch electrode.

In conclusion, the illumination device includes an electrode structure overlaid on an OLED panel. The electrode structure provides touch functionality to control the OLED panel, and the electrode structure also serves as a package structure for the OLED panel to increase the service life of the OLED panel. Moreover, the sensitivity of the electrode structure is improved by the structures of the touch electrodes.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
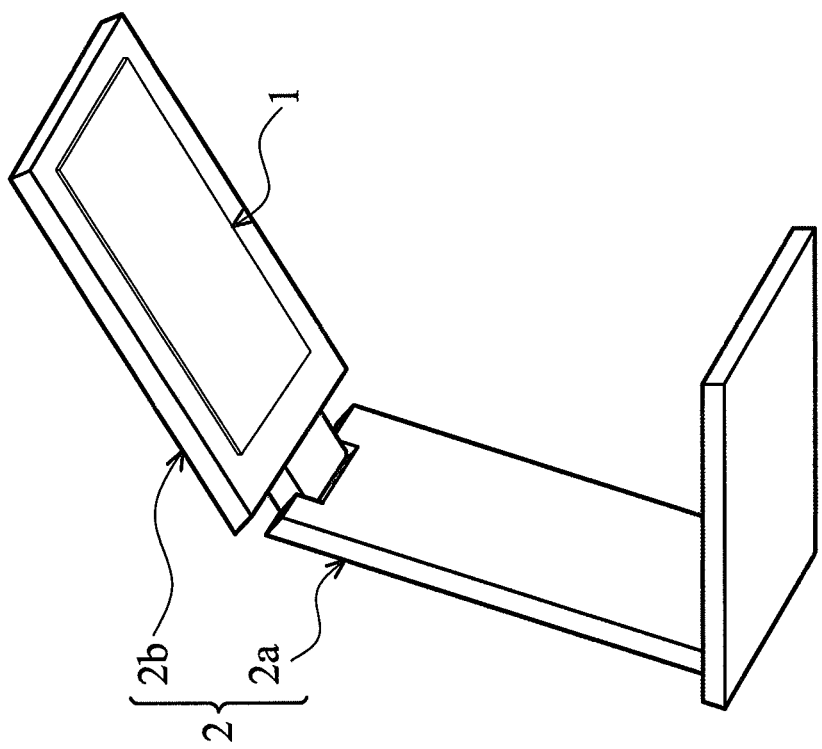
FIG. 1 is a perspective view of an illumination device in accordance with the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a perspective view of an illumination device 100 in accordance with the present disclosure. The illumination device 100 is configured to illuminate a space, a room, an object, etc. In some embodiments, the illumination device 100 is a luminaire (a light fixture or a light fitting), such as a table lamp fixture, a standard lamp fixture, an office task light luminaire, a recessed light, a surface-mounted light, an outdoor light, a landscape light, an accent light, or a safelight.

The illumination device 100 includes an illumination module 1 and a holder 2. The illumination module 1 is configured to emit a light beam. The illumination module 1 is held by the holder 2.

In some embodiments, as shown in FIG. 1, the illumination device 100 is a table lamp fixture including a stand 2a and a holding element 2b. The stand 2a may be disposed on a table. The holding element 2b is connected to the stand 2a. The illumination module 1 is mounted at the holding element 2b. In some embodiments, the holding element 2b and the illumination module 1 are plate structures.

Figure 2:
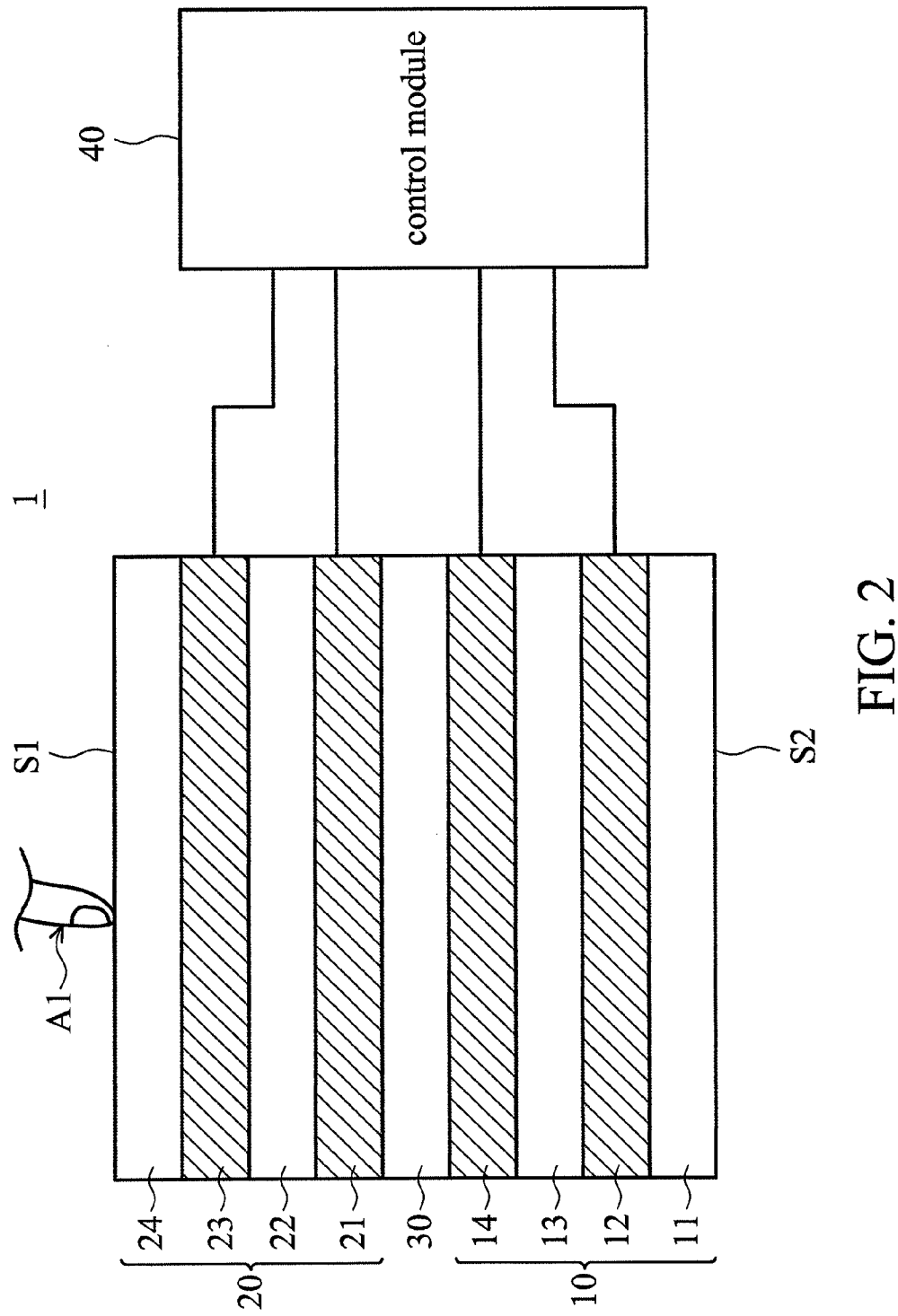
FIG. 2 is a schematic view of the illumination module in accordance with a first embodiment of the present disclosure.

FIG. 2 is a schematic view of the illumination module 1 in accordance with a first embodiment of the present disclosure. The illumination module 1 includes an OLED panel 10, an electrode structure 20, a connection layer 30 and a control module 40. The OLED panel 10 and the electrode structure 20 are film structures. The OLED panel 10 and the electrode structure 20 are planar or curved.

The OLED panel 10 is configured to emit a light beam. The electrode structure 20 is overlaid on the OLED panel 10, and provides touch functionality. The connection layer 30 is located between the OLED panel 10 and the electrode structure 20, and configured to combine with the OLED panel 10 and the electrode structure 20.

The control module 40 is electrically connected to the OLED panel 10 and the electrode structure 20. The electrode structure 20 generates a touch signal according to a touch event, and the control module 40 controls the OLED panel 10 according to the touch signal.

In some embodiments, the OLED panel 10 is an OLED (Organic Light-Emitting Diode) panel. The OLED panel 10 includes a substrate 11, a number of control electrodes 12, a light-emitting layer 13, and a number of control electrodes 14.

The substrate 11 may be made from transparent materials, such as glass. In some embodiments, the substrate 11 serves as a package structure for the illumination module 1 to protect the light-emitting layer 13 from liquid or moisture.

The control electrodes 12 are disposed on the substrate 11. The light-emitting layer 13 is overlaid on the control electrodes 12. In some embodiments, the light-emitting layer 13 is an OLED layer. The light-emitting layer 13 is configured to emit a light beam. The control electrodes 14 are disposed on the light-emitting layer 13.

The control electrodes 12 and 14 are made from transparent conductive materials, such as indium tin oxide (ITO), indium zinc oxide (IZO), or aluminum zinc oxide (AZO). The control electrodes 12 and 14 are electrically connected to the control module 40.

In the embodiment, the electrode structure 20 includes a number of touch electrodes 21, a dielectric layer 22, a number of touch electrodes 23, and a substrate 24. In some embodiments, the substrate 11, the control electrodes 12, the light-emitting layer 13, the control electrodes 14, the touch electrodes 21, the dielectric layer 22, the touch electrodes 23, the substrate 24, and the connection layer 30 are parallel to each other.

The touch electrodes 21 are disposed over the control electrode 14. The dielectric layer 22 is overlaid on the touch electrodes 21, and between the touch electrodes 21 and 23. The dielectric layer 22 is configured to separate the touch electrodes 21 and 23. The touch electrodes 23 are disposed on the dielectric layer 22.

In some embodiments, the touch electrodes 21 are transmitting electrodes, and the touch electrodes 23 are receiving electrodes. In some embodiments, the touch electrodes 21 are receiving electrodes, and the touch electrodes 23 are transmitting electrodes. The touch electrodes 21 and 23 are made from transparent conductive materials, such as indium tin oxide (ITO), indium zinc oxide (IZO), or aluminum zinc oxide (AZO). The touch electrodes 21 and 23 are electrically connected to the control module 40.

The substrate 24 is overlaid on the touch electrodes 23. In some embodiments, the substrate 24 is made from transparent materials, such as glass. In some embodiments, the substrate 24 or the entire electrode structure 20 serves as a package structure for the illumination module 1 to protect the light-emitting layer 13 from liquid or moisture.

The liquid or moisture permeating to the light-emitting layer 13 greatly decreases the service life of the OLED panel 1. Therefore, the service life of the OLED panel is increased by the protection of the substrate 24 or the entire electrode structure 20.

The connection layer 30 is located between the control electrode 14 and the touch electrode 21, and configured to combine with the control electrode 14 and the touch electrode 21. In some embodiments, the connection layer 30 is made from transparent insulation materials.

In some embodiments, the connection layer 30 is formed of a single piece. The control electrode 14 and the touch electrode 21 are respectively formed on two opposite sides of the connection layer 30 by a semiconductor manufacturing process, such as deposition process, etching process and/or photolithography process. Therefore, the thickness of the connection layer 30 is thin. The thickness of the illumination module 1 is decreased.

In some embodiments, the OLED panel 10 and the electrode structure 20 are transparent. The outer surfaces S1 and S2 of the illumination module 1 are light-emitting surfaces, and the light beam emitted by the light-emitting layer 13 passes though the outer surfaces S1 and S2.

Figure 3B:
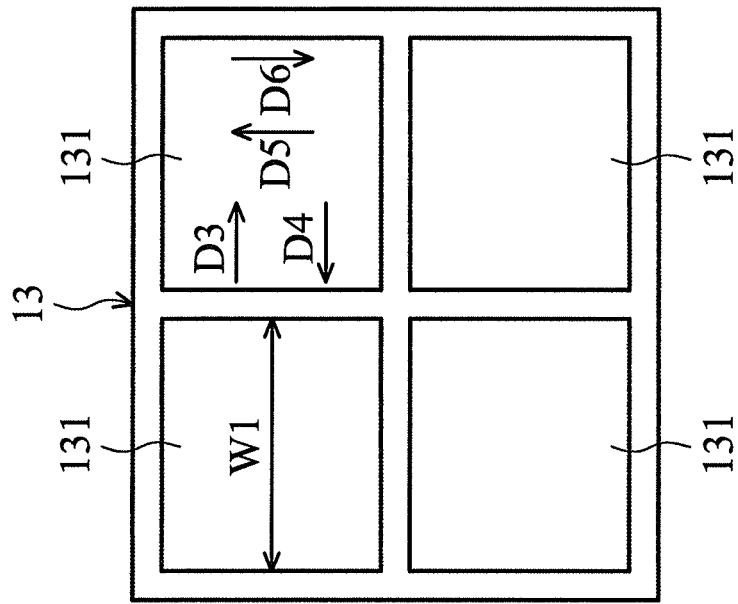
FIG. 3B is a top view of a light-emitting layer in accordance with some embodiments of the present disclosure.
Figure 3A:
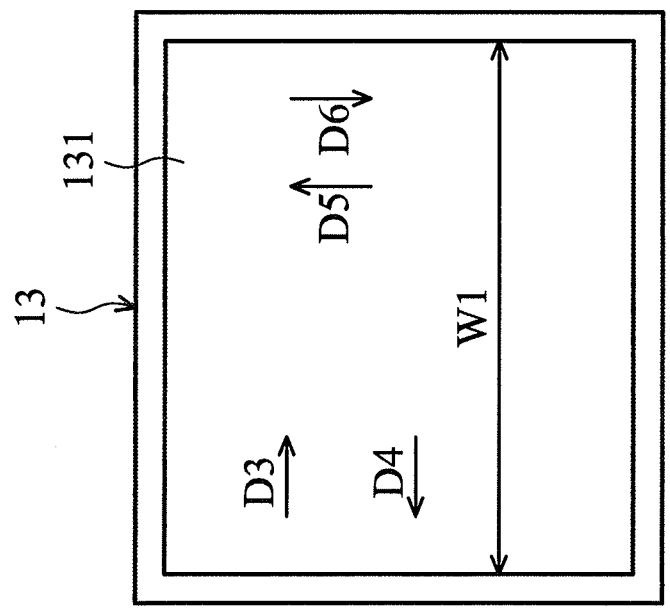
FIG. 3A is a top view of a light-emitting layer in accordance with some embodiments of the present disclosure.

FIG. 3A is a top view of the light-emitting layer 13 in accordance with some embodiments of the present disclosure. The light-emitting layer 13 further includes a light-emitting material 131. The light-emitting material 131 is a thin structure that is parallel to the light-emitting layer 13. The light-emitting material 131 is configured to emit a light beam. The light-emitting material 131 is formed of a single piece.

In some embodiments, the area of the light-emitting layer 13 is substantially equal to or greater than the area of the light-emitting material 131.

FIG. 3B is a top view of a light-emitting layer 13 in accordance with some embodiments of the present disclosure. The light-emitting layer 13 further includes a number of light-emitting materials 131. For example, as shown in FIG. 3B, there are four light-emitting materials 131 in the light-emitting layer 13. The light-emitting materials 131 are arranged on the control electrodes 12 in an array. Each of the light-emitting materials 131 is formed of a single piece.

In some embodiments, each of the light-emitting materials 131 is greater than N $cm^2$, and the N is a positive integer in a range from 1 to 2500. In some embodiments, the area of the light-emitting layer 13 is sustainably smaller than M times of an area of the light-emitting material 131, and the M is a positive integer, and in a range from 2 to 10 times.

Since the number of the light-emitting materials 131 is few, the manufacturing process of the illumination module 1 is simplified, and the manufacturing cost of the illumination module 1 is decreased.

Figure 4A:
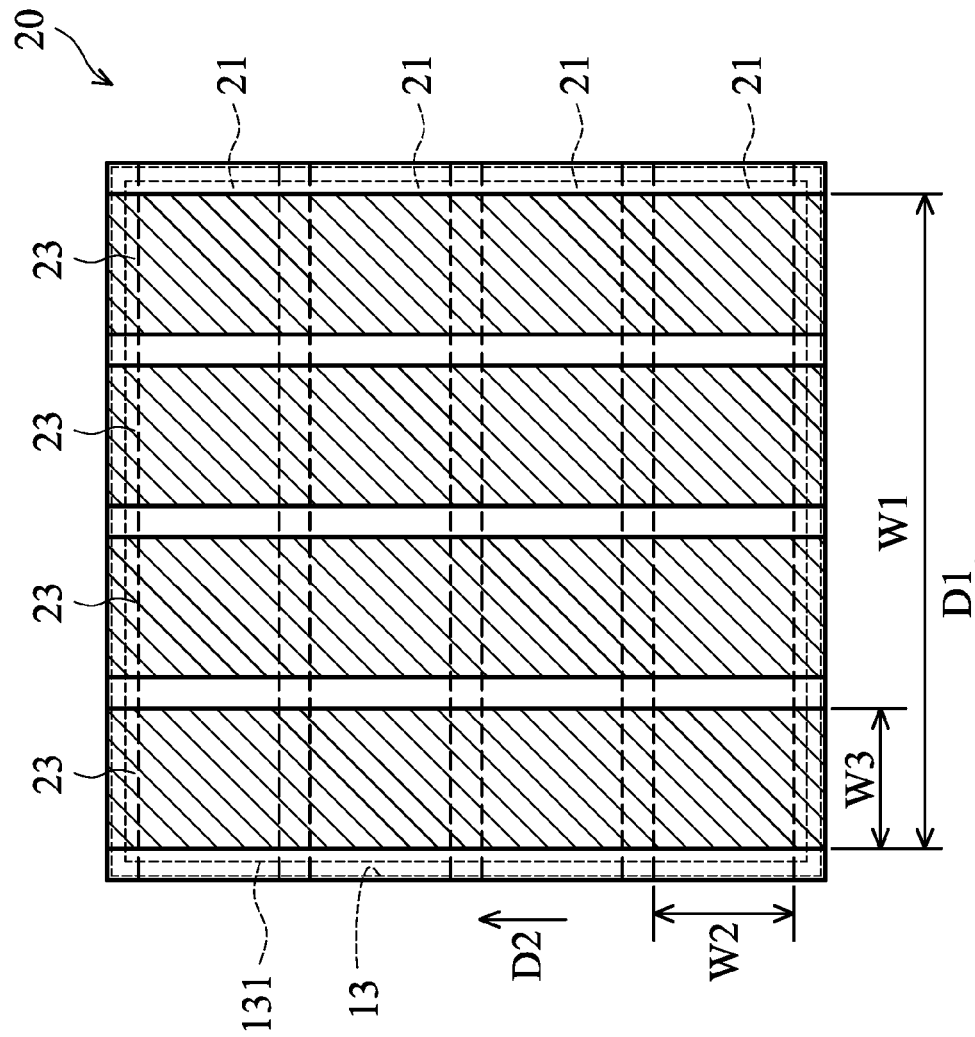
FIG. 4A is a top view of an electrode structure in accordance with some embodiments of the present disclosure.

FIG. 4A is a top view of the electrode structure 20 in accordance with some embodiments of the present disclosure. The touch electrodes 21 are arranged under the dielectric layer 22 in an array, and the touch electrodes 23 are arranged on the dielectric layer 22 in an array.

In some embodiments, the touch electrodes 21 are elongated structures. The touch electrodes 21 extend along a first direction D1, and are parallel to each other. The touch electrodes 21 are separated from each other, and each of the touch electrodes 21 is formed of a single piece.

The width W1 of each of the light-emitting materials 131 is greater than or substantially equal to the width W2 of each of the touch electrodes 21. In some embodiments, the width W1 of each of the light-emitting materials 131 is greater than half of the width W2 of each of the touch electrodes 21. In some embodiments, the area of each of the light-emitting materials 131 is greater than or substantially equal to the area of each of the touch electrodes 21. In some embodiments, the area of each of the light-emitting materials 131 is greater than half of the area of each of the touch electrodes 21.

In some embodiments, the touch electrodes 23 are elongated structures. The touch electrodes 23 are and extended along a second direction D2, which is perpendicular to the first direction D1, and parallel to each other. The touch electrodes 23 are separated from each other, and each of the touch electrodes 23 is formed of a single piece.

The width W1 of each of the light-emitting materials 131 is greater than or substantially equal to the width W3 of each of the touch electrodes 23. In some embodiments, the width W1 of each of the light-emitting materials 131 is greater than half of the width W3 of each of the touch electrodes 23. In some embodiments, the area of each of the light-emitting materials 131 is greater than or substantially equal to the area of each of the touch electrodes 23. In some embodiments, the area of each of the light-emitting materials 131 is greater than half of the area of each of the touch electrodes 23.

As shown in FIGS. 2, 3A, 3B and 4A, a touch event is triggered when a touch object A1, such as a finger, touches the outer surface S1 of the electrode structure 20 or the outer surface S2 of the OLED panel 10. When a touch event is triggered, the control module 40 controls the luminance or the color temperature of the light beam, or controls the light-emitting layer 13 to be enabled or disabled according to the touch event.

In some embodiments, the touch event includes a switch event, a luminance-adjustment event, and/or a color-temperature adjustment event. The switch event is triggered by touching a point on the outer surface S1 or the outer surface S2 over the touch electrodes 21 and/or the touch electrodes 23. When a switch event is triggered, the control module 40 controls the light-emitting layer 13 to be enabled or disabled according to the switch event.

For example, a switch event is triggered when the light-emitting layer 13 is disabled. The light-emitting layer 13 is enabled by the control module 40 transmitting power to the light-emitting layer 13 via the control electrodes 12 and the control electrodes 14, and then the light-emitting layer 13 emits a light beam. For example, a switch event is triggered when the light-emitting layer 13 is enabled. The control module 40 stops transmitting power to the light-emitting layer 13 via the control electrodes 12 and the control electrodes 14, and then the light-emitting layer 13 is disabled.

As shown in FIG. 3B, in some embodiments, each of the light-emitting materials 131 can be individually enabled or disabled by a switch event triggered over the corresponding light-emitting material 131.

As shown in FIGS. 2, 3A, 3B and 4A, the luminance-adjustment event is triggered by sliding the touch object A1 on the outer surface S1 or the outer surface S2. When a luminance-adjustment event is triggered, the control module 40 controls the luminance of the light beam according to the luminance-adjustment event For example, when the touch object A1 slides on the outer surface S1 or the outer surface S2 in the sliding direction D3 over the touch electrodes 21 and/or the touch electrodes 23, the control module 40 gradually increases the current being transmitted to the light-emitting materials 131 via the control electrodes 12 and the control electrodes 14, and the luminance of the light beam is gradually increased. When the touch object A1 slides on the outer surface S1 or the outer surface S2 in the sliding direction D4, the control module 40 gradually decreases the current being transmitted to the light-emitting materials 131 via the control electrodes 12 and the control electrodes 14 over the touch electrodes 21 and/or the touch electrodes 23, and the luminance of the light beam is gradually decreased.

As shown in FIG. 3B, in some embodiments, each of the light-emitting materials 131 can be adjusted individually by a luminance-adjustment event triggered over the corresponding light-emitting material 131.

As shown in FIGS. 2, 3A, 3B and 4A, the color-temperature adjustment event is triggered by sliding the touch object A1 on the outer surface S1 or the outer surface S2. When a color-temperature adjustment event is triggered, the control module 40 controls a color temperature of the light beam according to the color-temperature adjustment event.

For example, when the touch object A1 slides on the outer surface S1 or the outer surface S2 in the sliding direction D5 over the touch electrodes 21 and/or the touch electrodes 23, the control module 40 gradually increases the voltage of the light-emitting materials 131 via the control electrodes 12 and the control electrodes 14, and the color temperature of the light beam is gradually increased. When the touch object A1 slides on the outer surface S1 or the outer surface S2 in the sliding direction D6 over the touch electrodes 21 and/or the touch electrodes 23, the control module 40 gradually decreases the voltage of the light-emitting material 131 via the control electrodes 12 and the control electrodes 14, and the color temperature of the light beam is gradually decreased.

As shown in FIG. 3B, in some embodiments, each of the light-emitting materials 131 can be individually adjusted by a color-temperature adjustment event triggered over the corresponding light-emitting material 131.

Figure 4B:
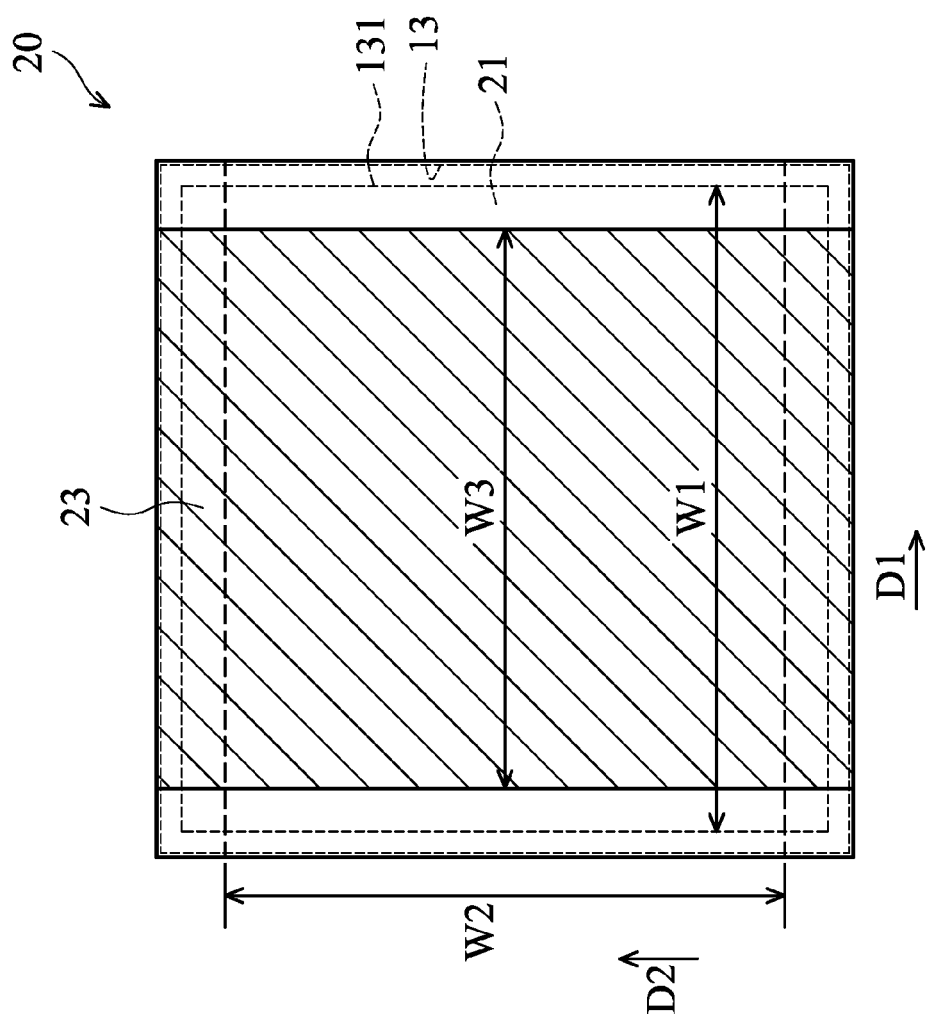
FIG. 4B is a top view of an electrode structure in accordance with some embodiments of the present disclosure.

FIG. 4B is a top view of an electrode structure 20 in accordance with some embodiments of the present disclosure. In some embodiments, the electrode structure 20 includes one touch electrode 21 and one touch electrode 23. The light-emitting layer 13 includes one light-emitting material 131 (as shown in FIG. 3A), one control electrode 12, and one control electrode 14.

The width W1 of the light-emitting material 131 is substantially equal to or greater than the width of the touch electrode 21 and/or the touch electrode 23. The area of the light-emitting material 131 is substantially equal to or greater than the area of the touch electrode 21 and/or the touch electrode 23.

Figure 5A:
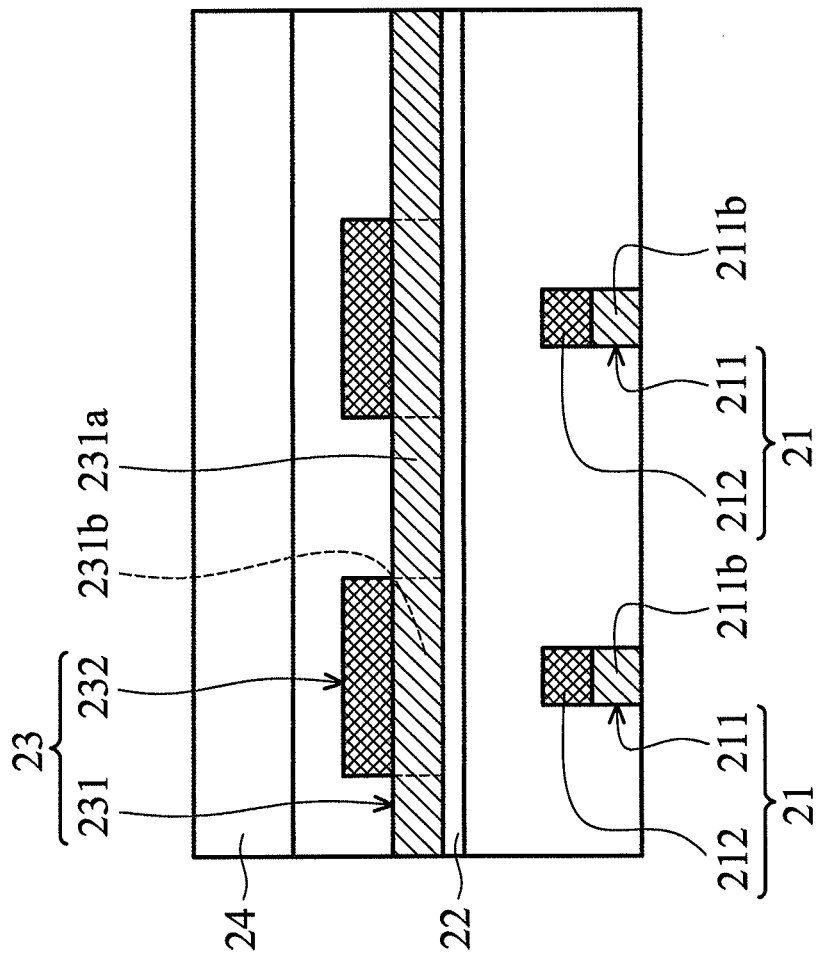
FIG. 5A is a schematic view of an electrode structure in accordance with some embodiments of the present disclosure.
Figure 5B:
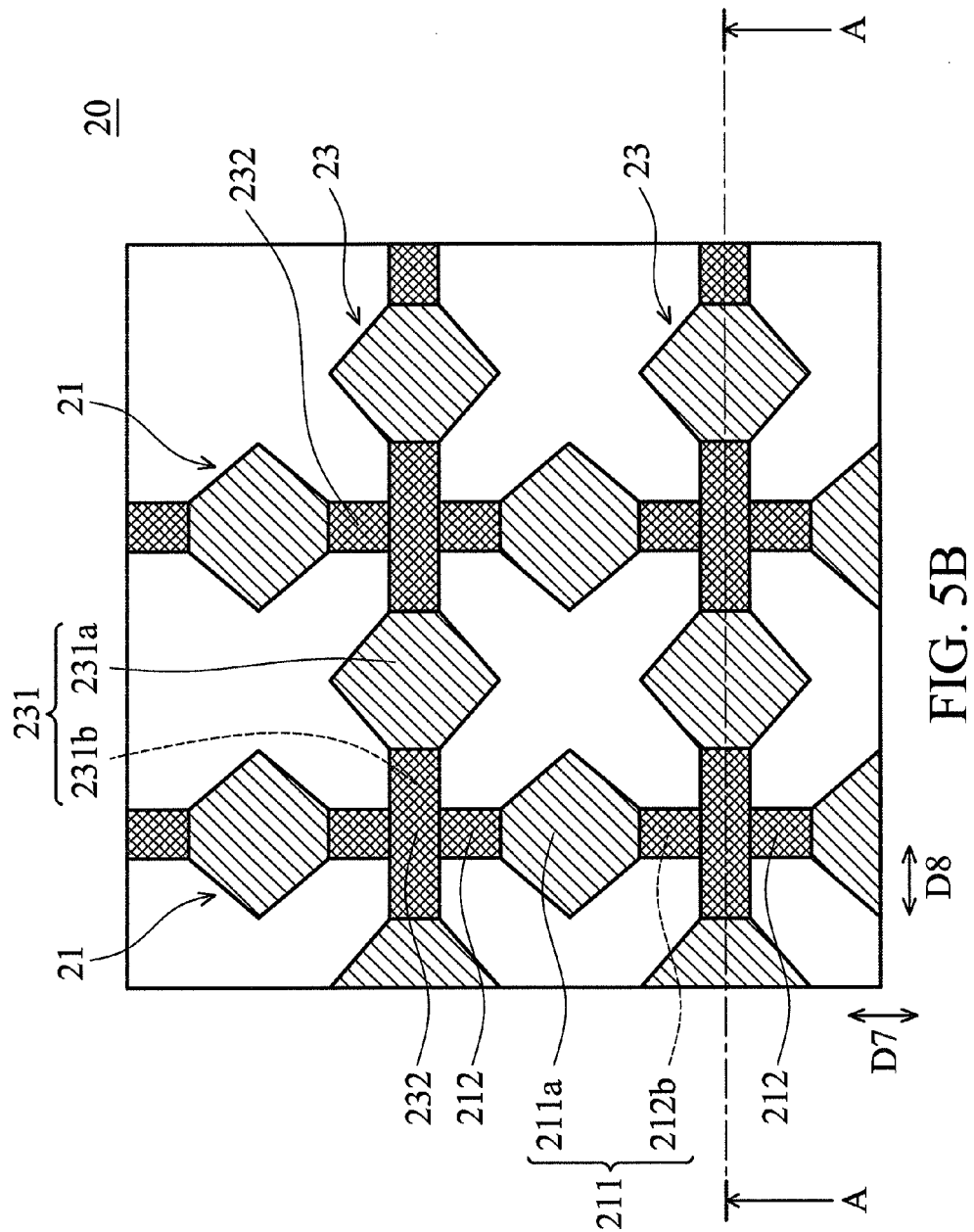
FIG. 5B is a top view of the electrode structure in FIG. 5A in accordance with some embodiments of the present disclosure.

FIG. 5A is a schematic view of an electrode structure 20 in accordance with some embodiments of the present disclosure. FIG. 5B is a top view of the electrode structure 20 in FIG. 5A in accordance with some embodiments of the present disclosure. FIG. 5A is a cross-sectional view along the line AA of FIG. 5B. The touch electrodes 21 substantially extend along a longitudinal direction D7, and are parallel to each other. The touch electrodes 23 are separated from the touch electrodes 21.

Moreover, the touch electrodes 23 substantially extend along a transverse direction D8, and are parallel to each other.

The dielectric layer 22 is located between the touch electrodes 21 and the touch electrodes 23.

Each of the touch electrodes 21 includes at least two conductive portions, and the conductive portions of the touch electrode 21 are electrically connected to the other conductive portions. In some embodiments, the conductive portions includes a conductive portion 211 and a conductive portion 212 connected to the conductive portion 211. The conductive portion 211 and the conductive portion 212 are plate structures parallel to the electrode structure 20. The conductive portions 211 are arranged in a plane that is parallel to the electrode structure 20. The control module 40 (as shown in FIG. 2) is electrically connected to the conductive portions 211.

The conductive portion 211 includes sensing sections 211a and connection sections 211b. Each of the connection sections 211b is connected to and disposed between two adjacent sensing sections 211a. The sensing sections 211a and the connection sections 211b are arranged alternately along the longitudinal direction D7.

In some embodiments, the sensing sections 211a are polygons or circles. The connection sections 211b are wire structures or rectangles. The area of the sensing section 211a is greater than the area of the connection sections 211b.

Each of the touch electrodes 23 includes a conductive portion 231 and a conductive portion 232 connected to the conductive portion 231. The conductive portion 231 and the conductive portion 232 are plate structures parallel to the electrode structure 20. The conductive portions 231 are arranged in a plane that is parallel to the electrode structure 20. The control module 40 (as shown in FIG. 2) is electrically connected to the conductive portions 231.

The conductive portion 231 includes sensing sections 231a and connection sections 231b. Each of the connection sections 231b is connected to two adjacent sensing sections 231a. The connection sections 231b and the sensing sections 231a are arranged alternately along the transverse direction D8.

In some embodiments, the sensing sections 231a are polygons or circles. The connection sections 231b are wire structures or rectangles. The area of the sensing section 231a is greater than the area of the connection sections 231b.

The conductive portion 211 includes conductive materials, and the conductive portion 212 includes conductive materials that are different from the conductive materials of the conductive portion 211. The conductive portion 231 includes conductive materials, and the conductive portion 232 includes conductive materials that are different from the conductive materials of the conductive portion 231. In some embodiments, the conductive materials of the conductive portion 231 are the same as the conductive materials of the conductive portion 211 (or the conductive portion 212). The conductive materials of the conductive portion 232 are the same as the conductive portion 212 (or the conductive portion 211).

In some embodiments, the conductive materials of the conductive portion 211 and/or the conductive portion 231 include conductive oxide, conductive polymer, carbon nanotube (CNT), graphene, nano-wire or a combination thereof. In some embodiments, the conductive materials of the conductive portion 211 and/or the conductive portion 231 include at least 50 wt % conductive oxide, conductive polymer, carbon nanotube (CNT), graphene, or a combination thereof. In some embodiments, the conductive materials of the conductive portion 212 and/or the conductive portion 232 include includes nano-wire or metal mesh.

In some embodiments, the conductive materials of the conductive portion 212 and/or the conductive portion 232 include conductive oxide, conductive polymer, carbon nanotube (CNT), graphene, nano-wire or a combination thereof. In some embodiments, the conductive materials of the conductive portion 212 and/or the conductive portion 232 include at least 50 wt % conductive oxide, conductive polymer, carbon nanotube (CNT), graphene, or a combination thereof. In some embodiments, the conductive materials of the conductive portion 211 and/or conductive portion 231 include nano-wire or metal mesh.

As shown in FIGS. 5A and 5B, the touch electrode 23 is located over the conductive portion 211 of the touch electrode 21. The sensing section 211a is not disposed on or under the connection section 211b, the conductive portion 212, the conductive portion 231, and/or the conductive portion 232. The sensing section 231a is not disposed on or under the connection section 231b, the conductive portion 211, the conductive portion 212, and/or the conductive portion 232.

The conductive portion 212 is disposed on the connection section 211b of the conductive portion 211. In some embodiments, the conductive portion 212 is not disposed on or under the sensing section 211a and/or the sensing section 231a.

The connection section 231b of the conductive portion 231 is disposed on the conductive portion 212. In some embodiments, the connection section 231b is not disposed on or under the sensing section 211a and/or the sensing section 231a. The conductive portion 232 is disposed on the connection section 231b of conductive portion 231. In some embodiments, the conductive portion 232 is not disposed on or under the sensing section 211a and/or the sensing section 231a.

Figure 5C:
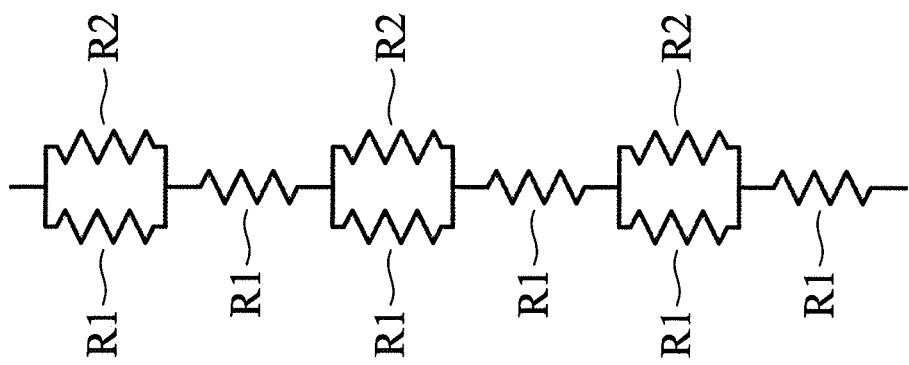
FIG. 5C is an equivalent circuit diagram of the first touch electrode in FIGS. 5A and 5B.

FIG. 5C is an equivalent circuit diagram of the touch electrode 21 in FIGS. 5A and 5B. The sensing section 211a and the connection section 211b include first resistances R1, and the conductive portion 212 includes a second resistance R2. The connection section 211b and the conductive portion 212 are connected in parallel, since the conductive portion 212 is disposed on and connected to the connection section 211b. In addition, FIG. 5C is a reference of the equivalent circuit diagram of the touch electrode 23 in FIGS. 5A and 5B.

Figure 6A:
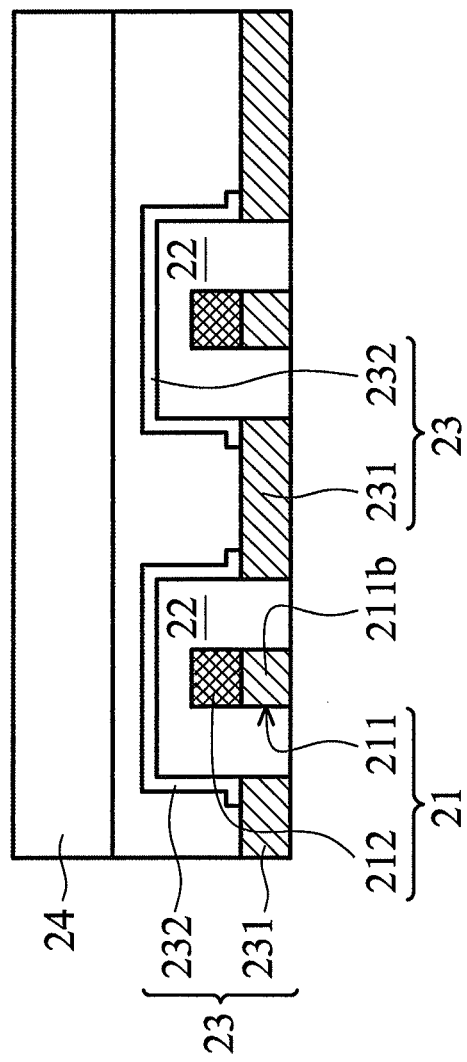
FIG. 6A is a schematic view of an electrode structure in accordance with some embodiments of the present disclosure.
Figure 6B:
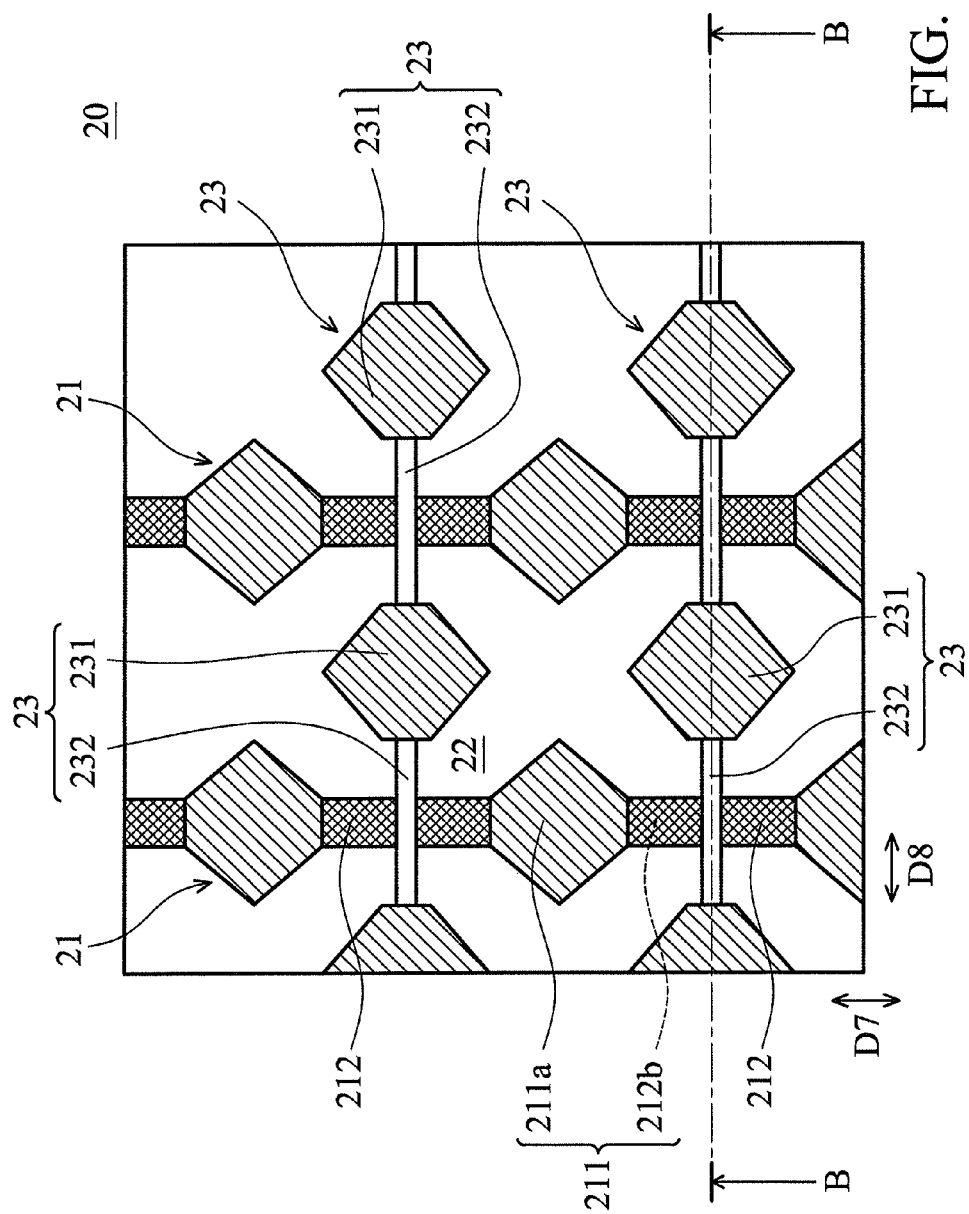
FIG. 6B is a top view of the electrode structure in FIG. 6A in accordance with some embodiments of the present disclosure.

FIG. 6A is a schematic view of an electrode structure 20 in accordance with some embodiments of the present disclosure. FIG. 6B is a top view of the electrode structure 20 in FIG. 6A in accordance with some embodiments of the present disclosure. FIG. 6A is a cross-sectional view along the line BB of FIG. 6B. The conductive portion 212 is disposed on the conductive portion 211. The dielectric layer 22 is located between the touch electrodes 21 and the touch electrodes 23. In some embodiments, the dielectric layer 22 is integrated with the second substrate 24 by using the same materials.

The dielectric layer 22, the conductive portion 211 and the conductive portion 231 are located in a plane that is parallel to the electrode structure and the OLED panel (as shown in FIG. 2). The connection section 211b is located between two adjacent conductive portions 231. The conductive portions 232 are wire structures. Two ends of the conductive portion 232 are connected to two adjacent conductive portions 231. In some embodiments, the conductive portion 232 is a U-shaped structure, and the conductive portion 212 is located in the conductive portion 232.

Figure 7A:
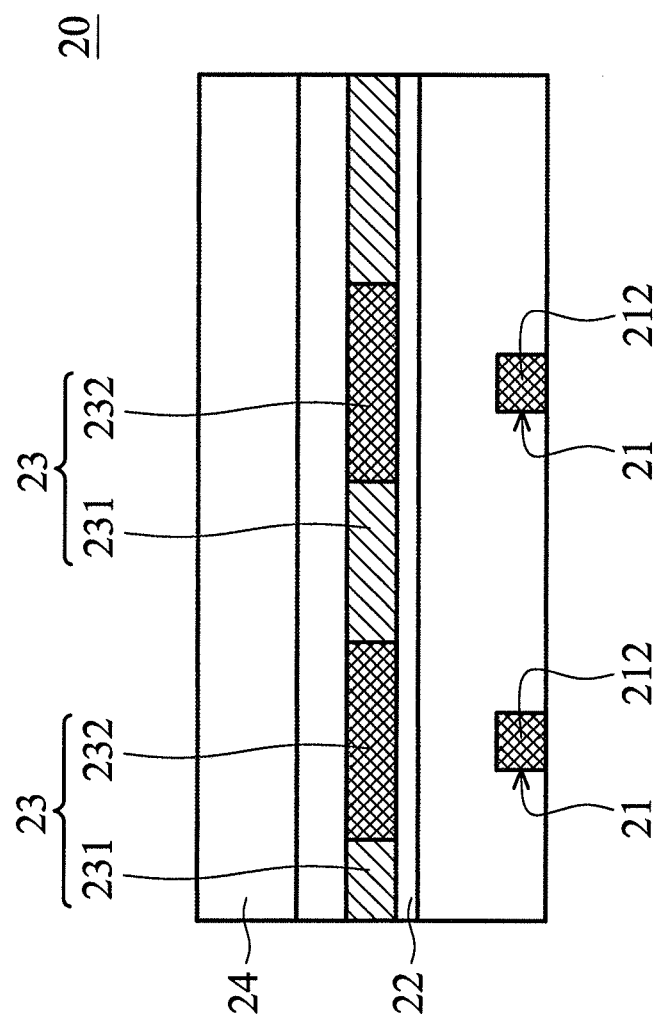
FIG. 7A is a schematic view of an electrode structure in accordance with some embodiments of the present disclosure.
Figure 7B:
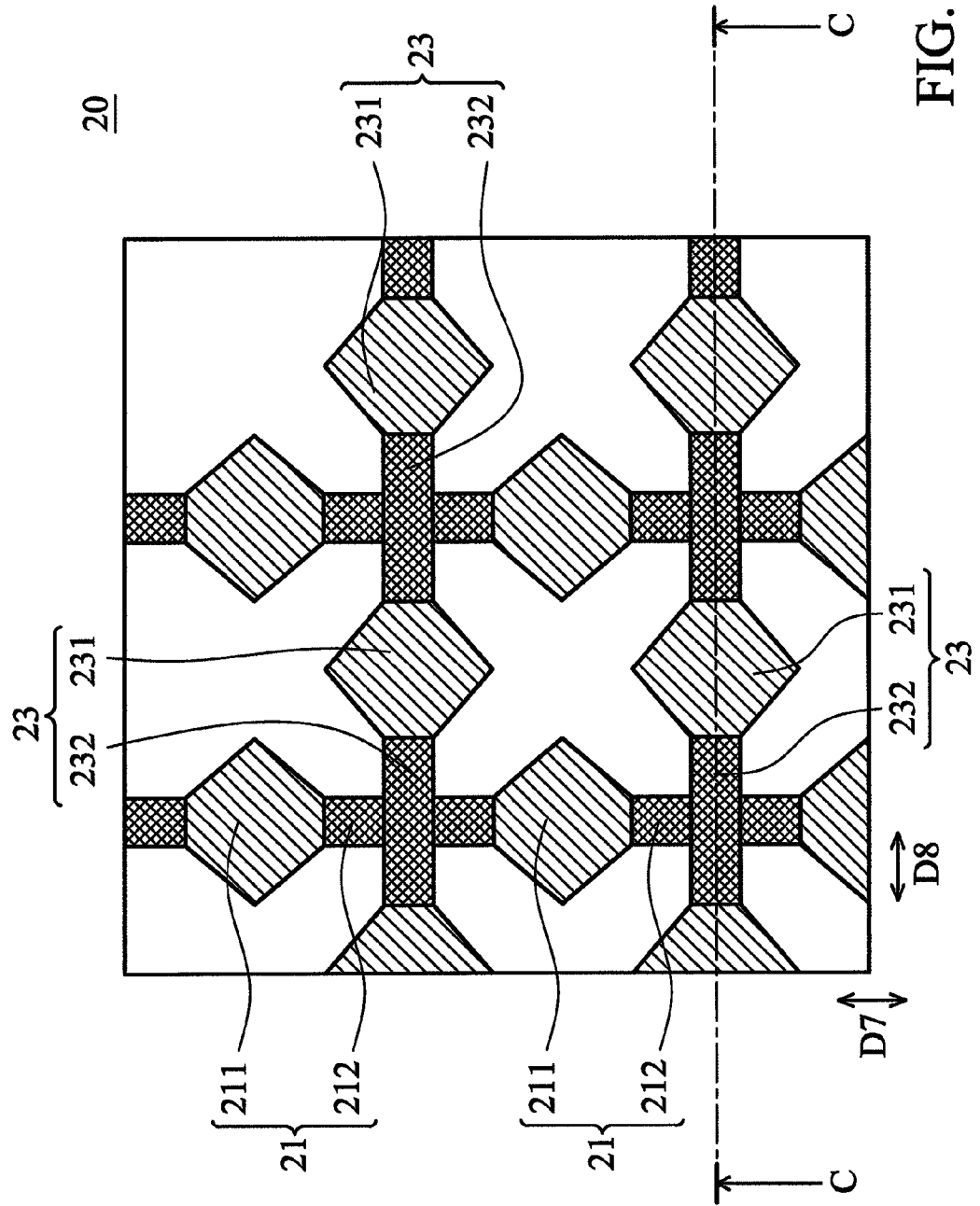
FIG. 7B is a top view of the electrode structure in FIG. 7A in accordance with some embodiments of the present disclosure.

FIG. 7A is a schematic view of the electrode structure 20 in accordance with some embodiments of the present disclosure. FIG. 7B is a top view of the electrode structure 20 in FIG. 7A in accordance with some embodiments of the present disclosure. FIG. 7A is a cross-sectional view along the line CC of FIG. 7B. The dielectric layer 22 is disposed on the touch electrodes 21, and the touch electrodes 23 are disposed on the dielectric layer 22.

The conductive portion 211 and the conductive portion 212 are located in a plane that is parallel to the electrode structure and the OLED panel (as shown in FIG. 2). The conductive portion 212 is connected to and located between two adjacent conductive portions 211.

The conductive portions 211 and the conductive portions 212 are arranged alternately along the longitudinal direction D7. In some embodiments, the conductive portions 211 are polygons or circles. The conductive portions 212 are wire structures or rectangles. The area of the conductive portion 211 is greater than the area of the conductive portion 212.

The conductive portion 232 of the touch electrode 23 is located over the conductive portion 212. The conductive portion 231 and the conductive portion 232 are located in a plane that is parallel to the electrode structure and the OLED panel (as shown in FIG. 2). The conductive portion 232 is connected to and located between two adjacent conductive portions 231.

Figure 7C:
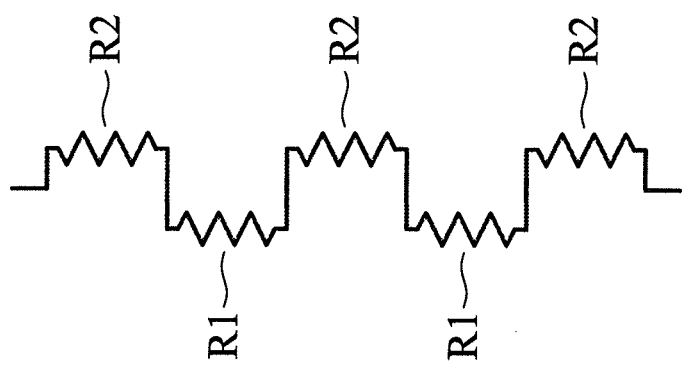
FIG. 7C is an equivalent circuit diagram of the first touch electrode in FIGS. 5A and 5B.

FIG. 7C is an equivalent circuit diagram of the touch electrode 21 in FIGS. 7A and 7B. The conductive portion 211 includes a first resistance R1, and the conductive portion 212 includes a second resistance R2. The conductive portion 211 and the conductive portion 212 are connected in series, along the longitudinal direction D7. In addition, FIG. 7C is a reference of the equivalent circuit diagram of the touch electrode 23 in FIGS. 7A and 7B.

Figure 8A:
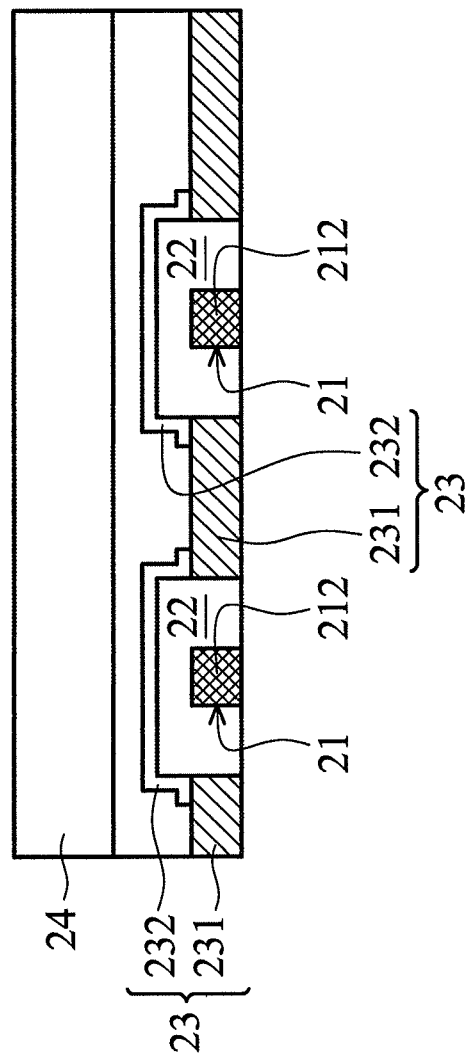
FIG. 8A is a schematic view of an electrode structure in accordance with some embodiments of the present disclosure.
Figure 8B:
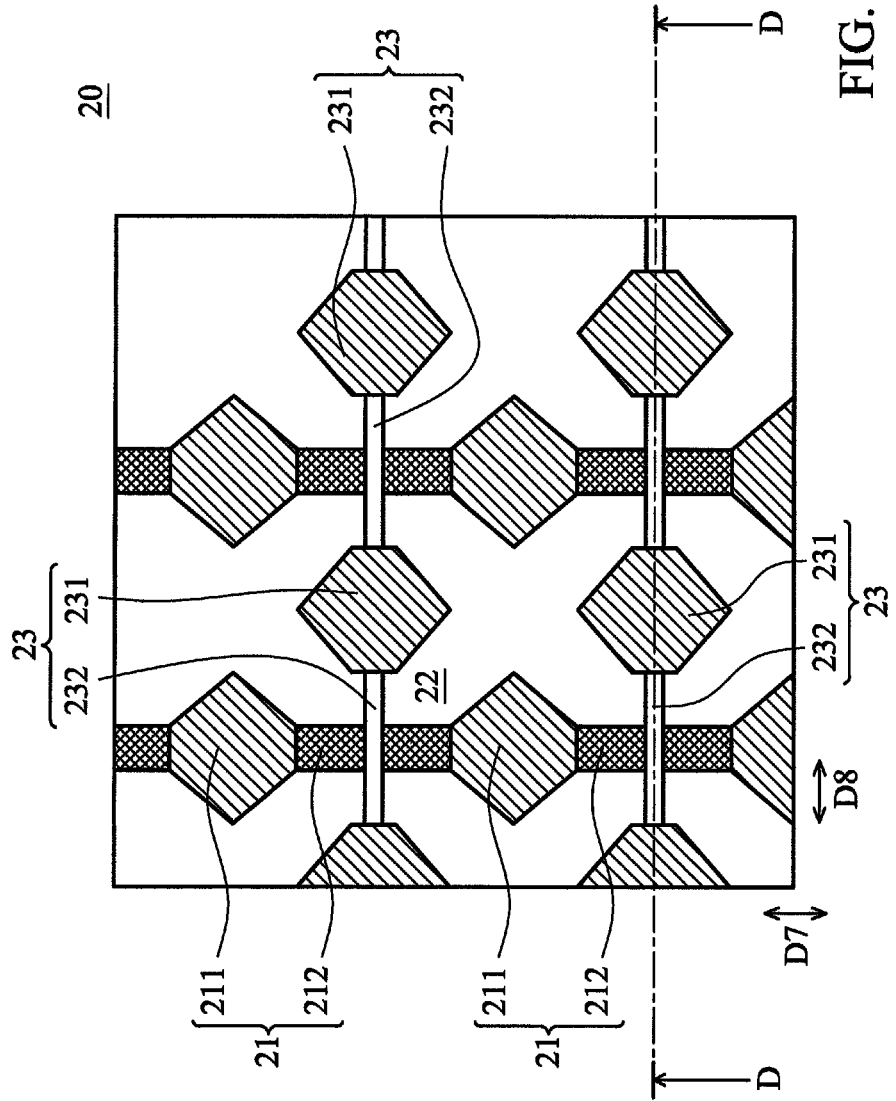
FIG. 8B is a top view of the electrode structure in FIG. 8A in accordance with some embodiments of the present disclosure.

FIG. 8A is a schematic view of the electrode structure 20 in accordance with some embodiments of the present disclosure. FIG. 8B is a top view of the electrode structure 20 in FIG. 8A in accordance with some embodiments of the present disclosure. FIG. 8A is a cross-sectional view along the line DD of FIG. 8B. The dielectric layer 22 is located between the touch electrodes 21 and the touch electrodes 23.

The conductive portion 211, the conductive portion 212, and the conductive portion 231 are located in a plane that is parallel to the electrode structure and the OLED panel (as shown in FIG. 2). The conductive portion 211 and the conductive portion 212 are arranged alternately along the longitudinal direction D7. The conductive portion 212 is connected to and located between two adjacent conductive portions 211, and is also located between two adjacent conductive portions 231 as shown in FIGS. 8A and 8B. The conductive portions 232 are wire structures. Two ends of the conductive portion 232 are connected to two adjacent conductive portions 231.

Figure 9:
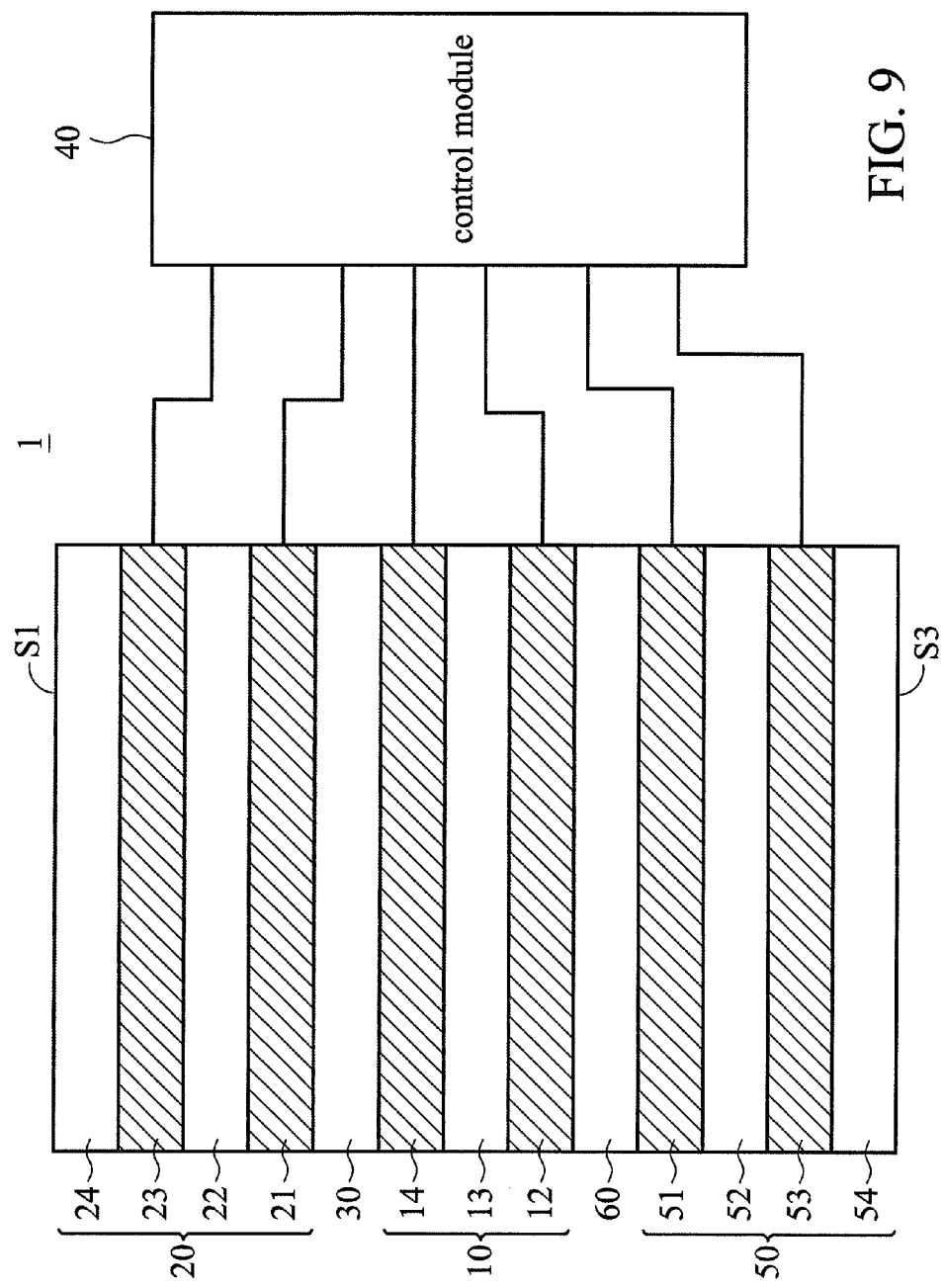
FIG. 9 is a schematic view of an illumination module in accordance with a second embodiment of the present disclosure.

FIG. 9 is a schematic view of an illumination module 1 in accordance with a second embodiment of the present disclosure. In the embodiments, the illumination module 1 further includes an electrode structure 50 and a connection layer 60. The substrate 11 of the OLED panel 10 is excluded. The electrode structure 50 is overlaid under the OLED panel 10. In other words, the electrode structure 20 and the electrode structure 50 are overlaid at two opposite sides of the OLED panel 10. Therefore, the touch function is provided at two opposite sides (outer surfaces S1 and S3) of the illumination module 1.

Furthermore, the electrode structure 20 and the electrode structure 50 are transparent. The outer surfaces S1 and S3 are light-emitting surfaces, and the light beam emitted by the light-emitting layer 13 passes though the outer surfaces S1 and S3.

The electrode structure 50 further includes a number of touch electrodes 51, a dielectric layer 52, a number of touch electrodes 53, and a substrate 54. In some embodiments, the touch electrodes 51 are disposed under the control electrode 12. The dielectric layer 52 is overlaid under the touch electrodes 51, and between the touch electrodes 51 and 53. The touch electrodes 53 are disposed under the dielectric layer 52. The substrate 54 is overlaid under the touch electrodes 53.

The touch electrodes 51 and 53 are electrically connected to the control module 40. The connection layer 60 is located between the control electrodes 12 and the touch electrodes 51, and configured to combine with the control electrodes 12 and the touch electrodes 51.

In some embodiments, the electrode structure 20 and the electrode structure 50 serve as package structures for the illumination module 1 to protect the light-emitting layer 13 from liquid or moisture.

Figure 10:
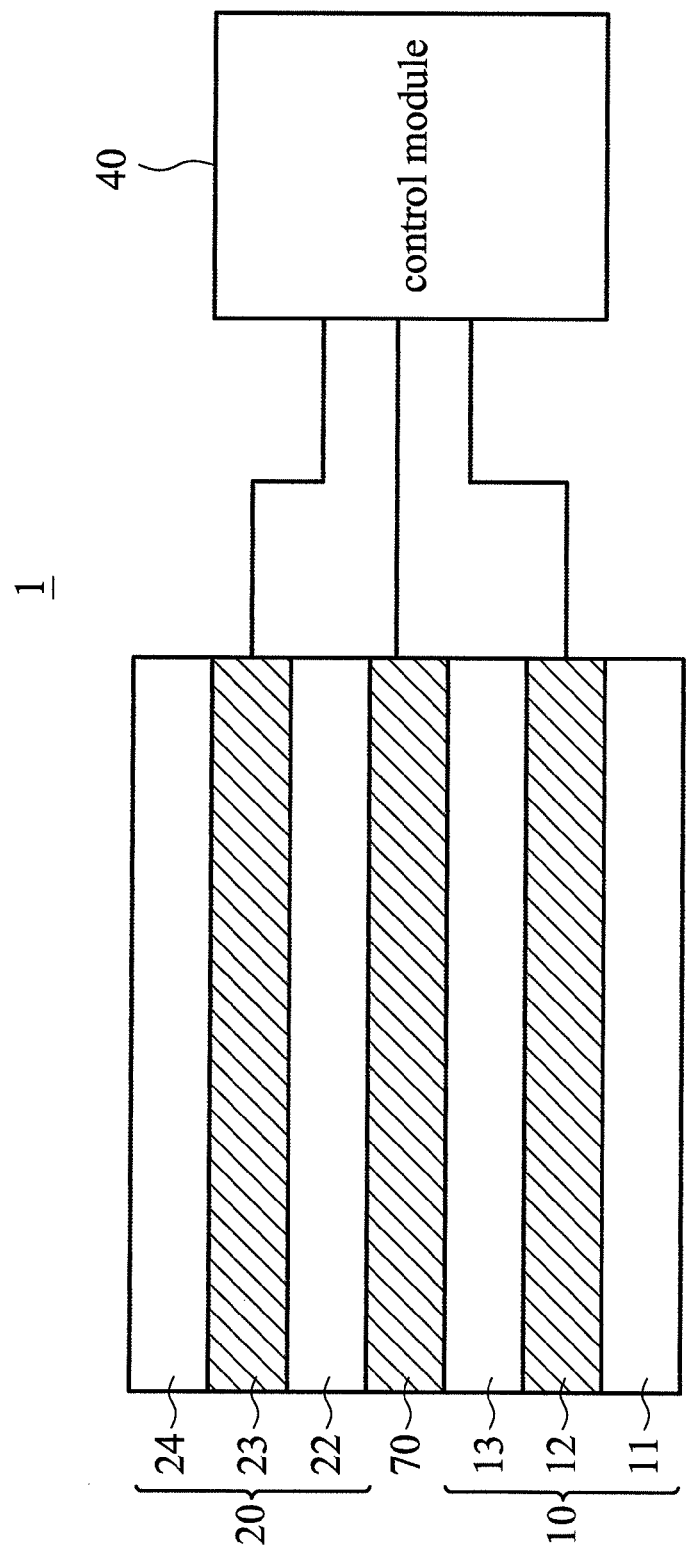
FIG. 10 is a schematic view of an illumination module in accordance with a third embodiment of the present disclosure.

FIG. 10 is a schematic view of an illumination module 1 in accordance with a third embodiment of the present disclosure. The main differences between the first embodiment and the second embodiment are described as follows. The touch electrodes 21, the control electrodes 14 and the connection layer 30 of the first embodiment are replaced by the common electrodes 70. In other words, the common electrodes 70 serve as the touch electrodes 21 and the control electrodes 14.

Since the connection layer 30 of the first embodiment is excluded and the touch electrodes 21 and the control electrodes 14 are integrated as the common electrodes 70, the thickness of the illumination module 1 is decreased further.

The common electrodes 70 are located between the light-emitting layer 13 and under the dielectric layer 22, and connected to the light-emitting layer 13 and the dielectric layer 22. The common electrodes 70 are electrically connected to the control module 40.

In some embodiments, the structure of the common electrode 70 is substantially the same as the touch electrode 21 or 23. The common electrode 70 includes at least two conductive portions. The conductive portions of the common electrode 70 are electrically connected to the other conductive portions of the common electrode 70.

In some embodiments, the structure of the control electrode 12 is substantially the same as the touch electrode 21 or 23. The control electrode 12 includes at least two conductive portions. The conductive portions of the control electrode 12 are electrically connected to the other conductive portions of the control electrode 12.

The touch electrodes 23 and the common electrodes 70 generate a touch signal according to a touch event, and the control module 40 controls the light-emitting layer 13 via the control electrodes 12 and the common electrodes 70 according to the touch signal.

In some embodiments, the common electrodes 70 are applied to the second embodiment. The common electrodes 70 are located between the OLED panel 10 and the electrode structure 20, and between the OLED panel 10 and the electrode structure 50.

Figure 11:
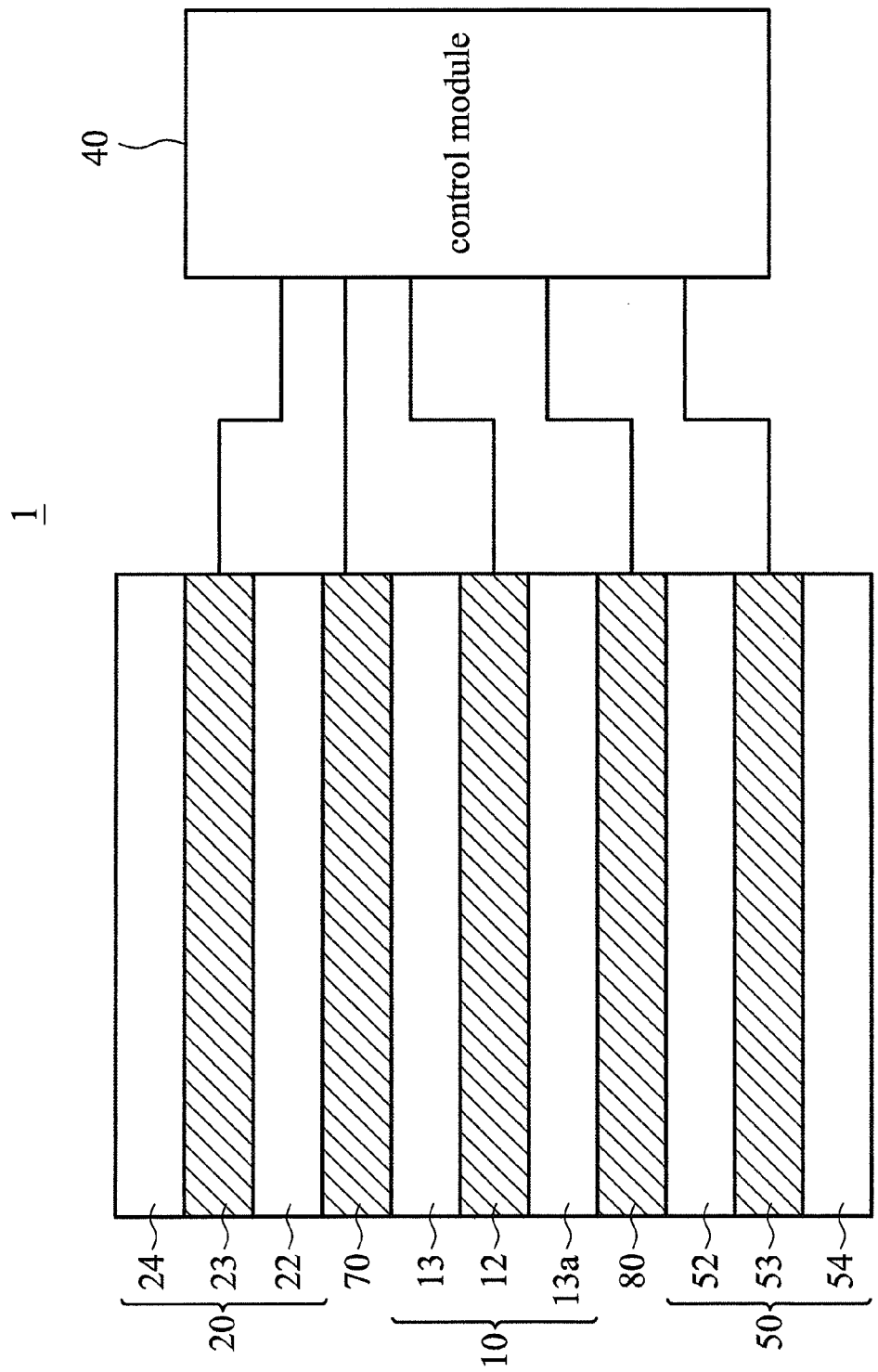
FIG. 11 is a schematic view of an illumination module in accordance with a fourth embodiment of the present disclosure.

FIG. 11 is a schematic view of an illumination module 1 in accordance with a fourth embodiment of the present disclosure. The main differences between the fourth embodiment and the third embodiment are described as follows. The substrate 11 of the third embodiment is replaced by a light-emitting layer 13a. The second light-emitting layer 13a is disposed under the control electrode 12.

The illumination module 1 further includes a number of common electrodes 80 disposed under the light-emitting layer 13a, and an electrode structure 50 disposed under the common electrodes 80. In some embodiments, the electrode structure 20 and the electrode structure 50 serve as package structures for the illumination module 1 to protect the light-emitting layer 13 from liquid or moisture.

The electrode structure 50 includes a dielectric layer 52, a number of touch electrodes 53, and a substrate 54. In some embodiments, the dielectric layer 52 is overlaid under the common electrodes 80. The touch electrodes 53 are disposed under the dielectric layer 52. The substrate 54 is overlaid under the touch electrodes 53.

The touch electrodes 53 and the common electrodes 80 are electrically connected to the control module 40. The touch electrodes 53 and the common electrodes 80 generate a touch signal according to a touch event. The control module 40 controls the light-emitting layer 13a via the control electrodes 12 and the common electrodes 80 according to the touch signal. The control module 40 controls a luminance or a color temperature of the light beam, or controls the light-emitting layer 13a to be enabled or disabled according to the touch event.

In the embodiments, the colors of the light beams emitted by the light-emitting layer 13 and 13a may be different or the same. The light-emitting layer 13 or 13a may be enabled or disabled individually. Therefore, the light beams emitted by the illumination device 1 are more colorful and adjustable.

In conclusion, the illumination device includes an electrode structure overlaid on an OLED panel. The electrode structure provides touch functionality to control the OLED panel, and the electrode structure also serves as a package structure for the OLED panel to increase the service life of the OLED panel. Moreover, the sensitivity of the electrode structure is improved by the structures of the touch electrodes.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An illumination device, comprising:
   an OLED panel comprising a light-emitting layer configured to emit a light beam;
   an electrode structure, overlaid on the OLED panel, comprising:
      a first touch electrode comprising at least two conductive portions, wherein the conductive portions of the first touch electrode are electrically connected to the other conductive portions; and
   a control module electrically connected to the OLED panel and the first touch electrode;
   wherein the light-emitting layer further comprises a light-emitting material, and a width of the light-emitting material is greater than half of a width of the first touch electrode.

2. The illumination device as claimed in claim 1, wherein the conductive portions of the first touch electrode comprise a first conductive portion and a second conductive portion connected to the first conductive portion, the second conductive portion is disposed on the first conductive portion.

3. The illumination device as claimed in claim 2, wherein the electrode structure further comprises a second touch electrode separated from the first touch electrode, and the first conductive portion and the second touch electrode are located in a plane that is parallel to the OLED panel.

4. The illumination device as claimed in claim 2, wherein the electrode structure further comprises a second touch electrode separated from the first touch electrode, and the second touch electrode is located over the first conductive portion.

5. The illumination device as claimed in claim 1, wherein the conductive portions of the first touch electrode comprise a first conductive portion and a second conductive portion connected to the first conductive portion, the first conductive portion and the second conductive portion are located in a plane that is parallel to the OLED panel.

6. The illumination device as claimed in claim 5, wherein the electrode structure further comprises a second touch electrode separated from the first touch electrode, and the first conductive portion, the second conductive portion, and the second touch electrode are located in a plane that is parallel to the OLED panel.

7. The illumination device as claimed in claim 5, wherein the electrode structure further comprises a second touch electrode separated from the first touch electrode, and the second touch electrode is located over the second conductive portion.

8. The illumination device as claimed in claim 1, wherein the electrode structure further comprises a second touch electrode separated from the first touch electrode, and a dielectric layer between the first touch electrode and the second touch electrode.

9. The illumination device as claimed in claim 1, wherein the conductive portions of the first touch electrode comprise a first conductive portion and a second conductive portion connected to the first conductive portion, wherein the first conductive portion comprises a first resistance, and the second conductive portion comprises a second resistance that is different from the first resistance.

10. The illumination device as claimed in claim 9, wherein the electrode structure further comprises a second touch electrode separated from the first touch electrode, and the second touch electrode comprises a third conductive portion and a fourth conductive portion connected to the third conductive portion, wherein the third conductive portion comprises a third resistance, and the fourth conductive portion comprises a fourth resistance that is different from the third resistance.

11. The illumination device as claimed in claim 10, wherein the second conductive portion is disposed on the first conductive portion, the third conductive portion is disposed on the second conductive portion, and the fourth conductive portion is disposed on the third conductive portion.

12. The illumination device as claimed in claim 10, wherein the first conductive portion and the second conductive portion are located in a first plane that is parallel to the OLED panel, and the third conductive portion and the fourth conductive portion are located in a second plane that is parallel to the OLED panel.

13. The illumination device as claimed in claim 1, wherein the conductive portions of the first touch electrode comprise a first conductive portion and a second conductive portion connected to the first conductive portion, wherein the first conductive portion comprises a first material, and the second conductive portion comprises a second material that is different from the first material.

14. The illumination device as claimed in claim 13, wherein the first material comprises conductive oxide, conductive polymer, carbon nanotube (CNT), graphene, or nano-wire, and the second material comprises nano-wire or metal mesh, or wherein the second material comprises conductive oxide, conductive polymer, carbon nanotube (CNT), graphene, or nano-wire, and the first material comprises nano-wire or metal mesh.

15. The illumination device as claimed in claim 13, wherein the electrode structure further comprises a second touch electrode separated from the first touch electrode, and the second touch electrode comprises a third conductive portion and a fourth conductive portion connected to the third conductive portion, wherein the third conductive portion comprises a third material, and the fourth conductive portion comprises a fourth material that is different from the third material.

16. The illumination device as claimed in claim 1, wherein the electrode structure is a touch panel, the electrode structure generates a touch signal according to a touch event, and the control module controls the light-emitting layer according to the touch signal, wherein the touch event comprises a switch event, a luminance-adjustment event, or a color-temperature adjustment event, wherein the control module controls the light-emitting layer to be enabled or disabled according to the switch event, controls a luminance of the light beam according to the luminance-adjustment event, or controls a color temperature of the light beam according to the color-temperature adjustment event.

17. The illumination device as claimed in claim 1, further comprising a common electrode disposed on the light-emitting layer, wherein the OLED panel further comprises a control electrode disposed under the light-emitting layer; and the electrode structure further comprises a first dielectric layer overlaid on the common electrode, and the first touch electrode is disposed on the first dielectric layer, wherein the control module is electrically connected to the control electrode, the common electrode, and the first touch electrode;

wherein the first touch electrode and the common electrode generate a first touch signal according to a first touch event, and the control module controls the light-emitting layer via the control electrode and the common electrode according to the first touch signal.

18. The illumination device as claimed in claim 17, wherein the control module controls a luminance or a color temperature of the light beam, or controls the light-emitting layer to be enabled or disabled according to the first touch event.

19. The illumination device as claimed in claim 17, wherein the common electrode or the control electrode comprises at least two conductive portions, wherein the conductive portions of the common electrode are electrically connected to the other conductive portions of the common electrode, and the conductive portions of the control electrode are electrically connected to the other conductive portions of the control electrode.

20. The illumination device as claimed in claim 19, wherein resistances or materials of the conductive portions of the common electrode are different, and resistances or materials of the conductive portions of the control electrode are different.

* * * * *